United States Patent
Morimoto et al.

(10) Patent No.: US 10,942,202 B2
(45) Date of Patent: Mar. 9, 2021

(54) CURRENT DETECTION DEVICE AND POWER SUPPLY DEVICE

(71) Applicant: Yazaki Corporation, Tokyo (JP)

(72) Inventors: Mitsuaki Morimoto, Susono (JP); Eiichiro Oishi, Susono (JP)

(73) Assignee: Yazaki Cornoration, Tokyo (JP)

( * ) Notice: Subject to any disclaimer, the term of this patent is extended or adjusted under 35 U.S.C. 154(b) by 198 days.

(21) Appl. No.: 16/393,040

(22) Filed: Apr. 24, 2019

(65) Prior Publication Data
US 2019/0331715 A1     Oct. 31, 2019

(30) Foreign Application Priority Data

Apr. 26, 2018   (JP) .............................. JP2018-085610

(51) Int. Cl.
| | |
|---|---|
| *G01R 19/14* | (2006.01) |
| *H02J 1/10* | (2006.01) |
| *H02H 7/20* | (2006.01) |
| *G01R 19/00* | (2006.01) |
| *H02H 1/00* | (2006.01) |

(52) U.S. Cl.
CPC ......... *G01R 19/14* (2013.01); *G01R 19/0038* (2013.01); *H02H 1/0007* (2013.01); *H02H 7/20* (2013.01); *H02J 1/10* (2013.01)

(58) Field of Classification Search
None
See application file for complete search history.

(56) References Cited

U.S. PATENT DOCUMENTS

| | | |
|---|---|---|
| 5,498,984 A | 3/1996 | Schaffer |
| 5,585,715 A | 12/1996 | Etter |
| | (Continued) | |

FOREIGN PATENT DOCUMENTS

| | | |
|---|---|---|
| EP | 0642213 A1 | 3/1995 |
| JP | 2001-305166 A | 10/2001 |
| JP | 2010-119261 A | 5/2010 |

OTHER PUBLICATIONS

Pete Semig et al., "A Current Sensing Tutorial—Part 1: Fundamentals", EE Times, Aug. 2, 2012, Retrieved on Dec. 8, 2016, http://www/eetimes.com/document.asp?doc_id=1279404&page_number=1 (4 pages total).

*Primary Examiner* — Daniel J Cavallari
*Assistant Examiner* — Terrence R Willoughby
(74) *Attorney, Agent, or Firm* — Sughrue Mion, PLLC (57) ABSTRACT

A current detection device includes a current sensor and a controller. The current sensor outputs a detection voltage according to a conduction current flowing through a bi-directional circuit in which current is capable of flowing in a positive direction and a negative direction that is a direction opposite to the positive direction. The controller calculates the conduction current based on the detection voltage output from the current sensor. For example, the controller calculates the conduction current based on an absolute value of a difference between a reference voltage that is the detection voltage output during a non-conductive state in which current is not flowing through the bi-directional circuit, and the detection voltage output during a conductive state in which current is flowing through the bi-directional circuit.

4 Claims, 4 Drawing Sheets

(56) References Cited

U.S. PATENT DOCUMENTS

| | | |
|---|---|---|
| 2003/0184326 A1* | 10/2003 | Throngnumchai ...... H02M 1/32 |
| | | 324/713 |
| 2006/0097731 A1 | 5/2006 | Taylor |
| 2011/0043958 A1 | 2/2011 | Nakamura et al. |
| 2013/0147278 A1 | 6/2013 | Arisawa et al. |
| 2013/0249412 A1* | 9/2013 | Nakajima ............... H05B 45/50 |
| | | 315/160 |
| 2014/0203639 A1 | 7/2014 | Rozman et al. |
| 2014/0217821 A1 | 8/2014 | Rozman et al. |
| 2015/0145588 A1 | 5/2015 | Chao et al. |
| 2016/0072393 A1 | 3/2016 | McIntyre |
| 2016/0294198 A1 | 10/2016 | Poulis et al. |
| 2017/0089958 A1* | 3/2017 | Guntreddi ............. H02M 3/156 |
| 2020/0216002 A1* | 7/2020 | Mazaki ................. H02M 3/158 |

\* cited by examiner

CURRENT DETECTION DEVICE AND POWER SUPPLY DEVICE

CROSS-REFERENCE TO RELATED APPLICATION(S)

The present application claims priority to and incorporates by reference the entire contents of Japanese Patent Application No. 2018-085610 filed in Japan on Apr. 26, 2018.

BACKGROUND OF THE INVENTION

1. Field of the Invention

The present invention relates to a current detection device and a power supply device.

2. Description of the Related Art

Conventionally, for example, Japanese Patent Application Laid-open No. 2010-119261 discloses a load circuit protection device for protecting a load circuit including an electric wire and a semiconductor switch. The load circuit protection device turns OFF the semiconductor switch on the basis of the temperature of the load circuit that is calculated using a temperature calculation formula according to the load current.

For example, the load circuit protection device disclosed in Japanese Patent Application Laid-open No. 2010-119261 described above may not be able to suitably detect the current flowing in the negative direction, when the load circuit protection device is applied to a bi-directional circuit in which the load current flows in the positive direction and the negative direction.

SUMMARY OF THE INVENTION

The present invention has been made in view of the above, and an object of the present invention is to provide a current detection device and a power supply device capable of suitably detecting the current flowing in both directions.

In order to solve the above mentioned problem and achieve the object, a current detection device according to one aspect of the present invention includes a current sensor that outputs a detection voltage according to a conduction current flowing through a bi-directional circuit in which current is capable of flowing in a positive direction and a negative direction that is a direction opposite to the positive direction; and a controller that calculates the conduction current based on the detection voltage output from the current sensor, wherein the controller calculates the conduction current based on an absolute value of a difference between a reference voltage that is the detection voltage output during a non-conductive state in which current is not flowing through the bi-directional circuit, and the detection voltage output during a conductive state in which current is flowing through the bi-directional circuit.

According to another aspect of the present invention, in the current detection device, it is preferable that the current sensor outputs the detection voltage larger than the reference voltage when the conduction current is flowing in the positive direction, and outputs the detection voltage smaller than the reference voltage when the conduction current is flowing in the negative direction, and the controller calculates the conduction current based on voltage obtained by subtracting the reference voltage from the detection voltage when the conduction current is flowing in the positive direction, and calculates the conduction current based on voltage obtained by subtracting the detection voltage from the reference voltage when the conduction current is flowing in the negative direction.

In order to achieve the object, a power supply device according to still another aspect of the present invention includes first and second electric power supply units that supply electric power to a load unit; a switch that conducts or interrupts conduction current that flows through a bi-directional circuit to which electric power is supplied from the first electric power supply unit and in which current is capable of flowing in a positive direction, and to which electric power is supplied from the second electric power supply unit and in which current is capable of flowing in a negative direction that is a direction opposite to the positive direction; a current sensor that outputs a detection voltage according to the conduction current; and a controller that controls the switch by calculating the conduction current based on the detection voltage output from the current sensor, wherein the controller controls the switch according to the conduction current calculated based on an absolute value of a difference between a reference voltage that is the detection voltage output during a non-conductive state in which current is not flowing through the bi-directional circuit, and the detection voltage output during a conductive state in which current is flowing through the bi-directional circuit.

According to still another aspect of the present invention, in the power supply device, it is preferable that the controller turns OFF the switch based on a heat quantity of the bi-directional circuit defined according to the conduction current and a predetermined positive direction interruption threshold, when the conduction current is flowing in the positive direction, and the controller turns OFF the switch based on the heat quantity of the bi-directional circuit defined according to the conduction current and a predetermined negative direction interruption threshold, when the conduction current is flowing in the negative direction.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Modes (embodiments) for carrying out the present invention will now be described in detail with reference to the accompanying drawings. It is not intended that the present invention be limited by what has been described in the following embodiments. Moreover, the components described below include components that can be easily assumed by a person skilled in the art, and components that are substantially the same as those components. Furthermore, the components described below can be combined with one another as appropriate. Still furthermore, various omissions, replacements, or modifications can be made without departing from the scope and spirit of the present invention.

First Embodiment

Figure 1:
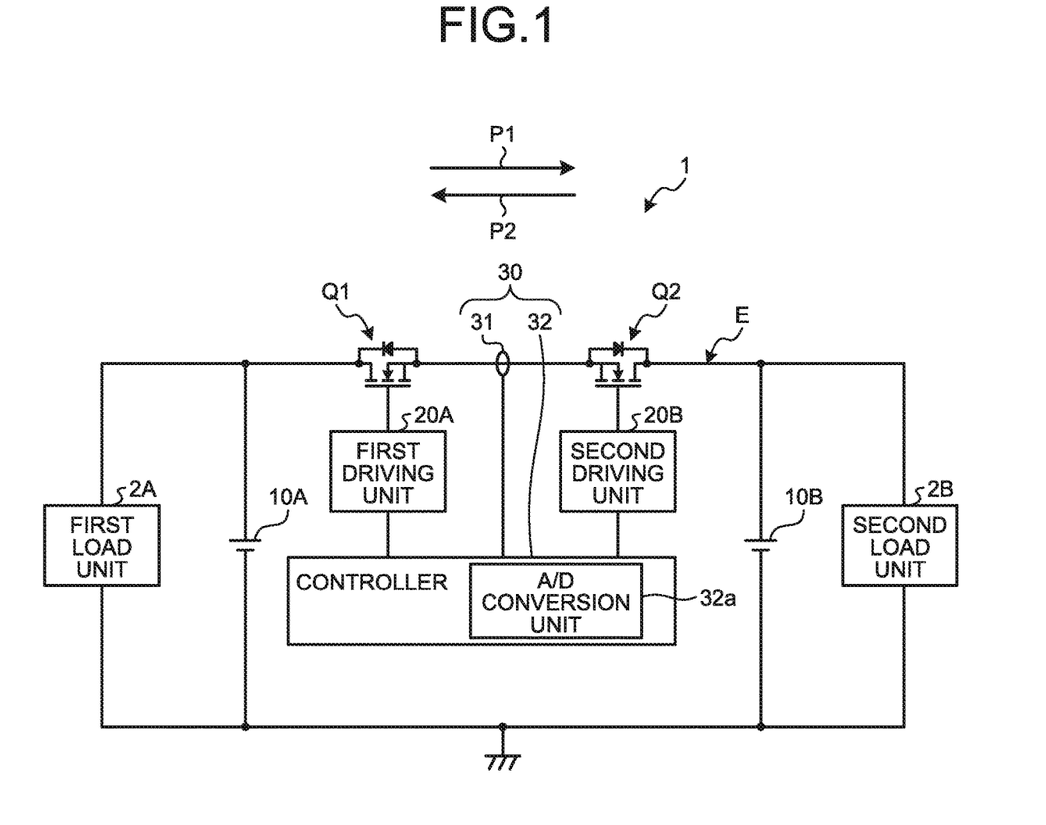
FIG. 1 is a block diagram illustrating a configurational example of a power supply device according to a first embodiment.

A current detection device 30 and a power supply device 1 according to a first embodiment will be described. The power supply device 1 supplies electric power to a load unit such as a motor from a battery. The current detection device 30 is provided in the power supply device 1, and detects current that flows to the load unit such as the motor from the battery. The power supply device 1 includes a first battery 10A serving as a first electric power supply unit, a second battery 10B serving as a second electric power supply unit, a field-effect transistor (FET) Q1 serving as a switch, an FET Q2 serving as a switch, a first driving unit 20A, a second driving unit 20B, and the current detection device 30. The power supply device 1 is what is called a two-battery device provided with the first battery 10A and the second battery 10B. The power supply device 1 supplies electric power to a first load unit 2A and a second load unit 2B connected in parallel.

The first battery 10A is connected to the first load unit 2A in parallel, and supplies electric power to the first and second load units 2A and 2B. The second battery 10B is connected to the second load unit 2B in parallel, and supplies electric power to the first and second load units 2A and 2B. In this example, the current that flows toward the second load unit 2B side from the first battery 10A side is referred to as a current in a positive direction P1. Alternatively, the current that flows toward the first load unit 2A side from the second battery 10B side is referred to as a current in a negative direction P2. The positive direction P1 and the negative direction P2 are opposite directions from each other. In other words, the positive direction P1 is the direction of the current that flows from one side between the FETs Q1 and Q2, and the negative direction P2 is the direction of the current that flows from another side between the FETs Q1 and Q2. The power supply device 1 forms a bi-directional circuit E in which the current can flow in the positive direction P1 and the negative direction P2. In the following explanation, the current that flows through the bi-directional circuit E is also referred to as a conduction current I.

The FET Q1 conducts or interrupts current. For example, the FET Q1 is an N-channel metal-oxide-semiconductor field-effect transistor (MOSFET). However, it is not limited thereto. The FET Q1 is provided between the first battery 10A and the second load unit 2B, and conducts or interrupts the current that flows to the second load unit 2B from the first battery 10A. The FET Q1 is including a drain terminal serving as an input terminal, a source terminal serving as an output terminal, and a gate terminal serving as a control terminal. The drain terminal is connected to the positive electrode side of the first battery 10A. The source terminal is connected to the source terminal of the FET Q2. The gate terminal is connected to the connection terminal of the first driving unit 20A. The gate terminal conducts or interrupts the current that flows to the source terminal from the drain terminal, on the basis of the voltage applied from the first driving unit 20A. The FET Q1 conducts the current that flows between the drain terminal and the source terminal by turning ON the gate terminal. Moreover, the FET Q1 interrupts the current that flows to the source terminal from the drain terminal by turning OFF the gate terminal.

The FET Q2 conducts or interrupts current. For example, the FET Q2 is the N-channel MOSFET. However, it is not limited thereto. The FET Q2 is provided between the second battery 10B and the first load unit 2A, and conducts or interrupts the current that flows to the first load unit 2A from the second battery 10B. The FET Q2 is including a drain terminal serving as an input terminal, a source terminal serving as an output terminal, and a gate terminal serving as a control terminal. The drain terminal is connected to the positive electrode side of the second battery 10B. The source terminal is connected to the source terminal of the FET Q1. The gate terminal is connected to the connection terminal of the second driving unit 20B. The gate terminal conducts or interrupts the current that flows to the source terminal from the drain terminal, on the basis of the voltage applied from the second driving unit 20B. The FET Q2 conducts the current that flows between the drain terminal and the source terminal by turning ON the gate terminal. Moreover, the FET Q2 interrupts the current that flows to the source terminal from the drain terminal by turning OFF the gate terminal.

The first driving unit 20A is a circuit for driving the FET Q1. The first driving unit 20A is connected to a controller 32 and the gate terminal of the FET Q1, and turns ON or turns OFF the FET Q1 on the basis of the driving signal output from the controller 32.

The second driving unit 20B is a circuit for driving the FET Q2. The second driving unit 20B is connected to the controller 32 and the gate terminal of the FET Q2, and turns ON or turns OFF the FET Q2 on the basis of the driving signal output from the controller 32.

The current detection device 30 detects current. The current detection device 30 is including a current sensor 31 and the controller 32. The current sensor 31 detects current. For example, a hall type current sensor may be used for the current sensor 31. However, it is not limited thereto. The current sensor 31 is provided between the source terminal of the FET Q1 and the source terminal of the FET Q2. The current sensor 31 outputs detection voltage V1 corresponding to the conduction current I that flows through the bi-directional circuit E (see FIG. 2). When a reference voltage Vth is the detection voltage V1 output during the non-conductive state in which current is not flowing through the bi-directional circuit E, the current sensor 31 outputs the detection voltage V1 that is larger than the reference voltage Vth or that is smaller than the reference voltage Vth. In other words, when the reference voltage Vth is the detection voltage V1 output when the conduction current I is 0 A, the current sensor 31 outputs the detection voltage V1 larger than the reference voltage Vth or the detection voltage V1 smaller than the reference voltage Vth. For example, when the conduction current I is flowing in the positive direction P1, the current sensor 31 outputs the detection voltage V1 larger than the reference voltage Vth, and when the conduction current I is flowing in the negative direction P2, the current sensor 31 outputs the detection voltage V1 smaller than the reference voltage Vth.

Figure 2:
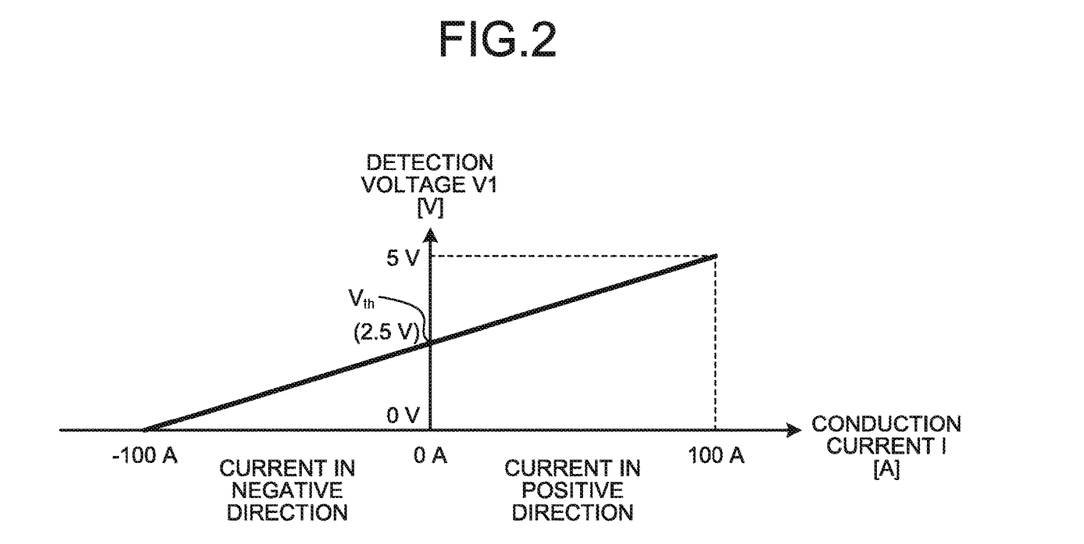
FIG. 2 is a diagram illustrating a relation between a conduction current and an output of a current sensor according to the first embodiment.

For example, in the first embodiment, it is assumed that the full scale of the current sensor 31 is ±100 A, and the input value of an analog/digital (A/D) conversion unit 32a of the controller 32 is between 0 V and 5 V. In this case, for example, as illustrated in FIG. 2, the current sensor 31 outputs 2.5 V as the detection voltage V1 output at 0 A, outputs 5 V as the detection voltage V1 output at 100 A, and outputs 0 V as the detection voltage V1 output at −100 A. In this case, the detection voltage V1 output when the conduction current I is 0 A, in other words, the reference voltage Vth is 2.5 V.

The controller 32 controls the FETs Q1 and Q2 via the first and second driving units 20A and 20B. The controller 32 is including an electronic circuit mainly composed of a known microcomputer that includes a central processing unit (CPU), a read-only memory (ROM) forming a storage unit, a random-access memory (RAM), and an interface. Moreover, the controller 32 is including the A/D conversion unit 32a.

The A/D conversion unit 32a is connected to the current sensor 31, and the detection voltage V1 of an analog signal is output from the current sensor 31. The A/D conversion unit 32a outputs the detection voltage V1 of the digital signal generated by A/D converting the detection voltage V1 of the analog signal to the controller 32. The controller 32 calculates the conduction current I that flows through the bi-directional circuit E, on the basis of the detection voltage V1 of the output digital signal. For example, the controller 32 calculates the conduction current I on the basis of an absolute value of a difference between the reference voltage Vth and the detection voltage V1. For example, when the conduction current I flows in the positive direction P1, the controller 32 calculates the conduction current I on the basis of the voltage obtained by subtracting the reference voltage Vth from the detection voltage V1. For example, when the detection voltage V1 is 5 V, the controller 32 determines that the conduction current I is in the positive direction P1 because the detection voltage V1 (5 V) is larger than the reference voltage Vth (2.5 V). The controller 32 then calculates the conduction current I (100 A) on the basis of 2.5 V that is obtained by subtracting the reference voltage Vth (2.5 V) from the detection voltage V1 (5 V).

When the conduction current I is flowing in the negative direction P2, the controller 32 calculates the conduction current I on the basis of the voltage obtained by subtracting the detection voltage V1 from the reference voltage Vth. For example, when the detection voltage V1 is 0 V, the controller 32 determines that the conduction current I is in the negative direction P2, because the detection voltage V1 (0 V) is smaller than the reference voltage Vth (2.5 V). The controller 32 then calculates the conduction current I (100 A) on the basis of 2.5 V obtained by subtracting the detection voltage V1 (0 V) from the reference voltage Vth (2.5 V). Consequently, even when the conduction current I is in the negative direction P2, the controller 32 can suitably calculate the conduction current I similar to when the conduction current I is in the positive direction P1.

The controller 32 calculates the heat quantity of the bi-directional circuit E on the basis of the calculated conduction current I. For example, the controller 32 calculates the heat quantity of the bi-directional circuit E on the basis of the following expression (1). In the following expression (1), T1 is the surrounding temperature, "I" is the conduction current, "Ron" is the electric resistance per unit length of the electric wire of the bi-directional circuit E, "Rth" is the heat resistance per unit length of the electric wire, "Cth" is the heat capacity per unit length of the electric wire, and "t" is the elapsed time.

$$T2=T1+I^2\times Ron\times Rth\{1-\exp(-t/Cth\cdot Rth)\} \qquad (1)$$

The controller 32 turns OFF the FETs Q1 and Q2 on the basis of the heat quantity of the bi-directional circuit E calculated from the expression (1) and a predetermined interruption threshold. For example, the controller 32 compares between the heat quantity of the bi-directional circuit E and the interruption threshold. When the heat quantity of the bi-directional circuit E is equal to or more than the interruption threshold, the controller 32 interrupts the bi-directional circuit E by turning OFF the FETs Q1 and Q2. When the heat quantity of the bi-directional circuit E is less than the interruption threshold, the controller 32 continues to turn ON the FETs Q1 and Q2 and does not interrupt the bi-directional circuit E.

Figure 3:
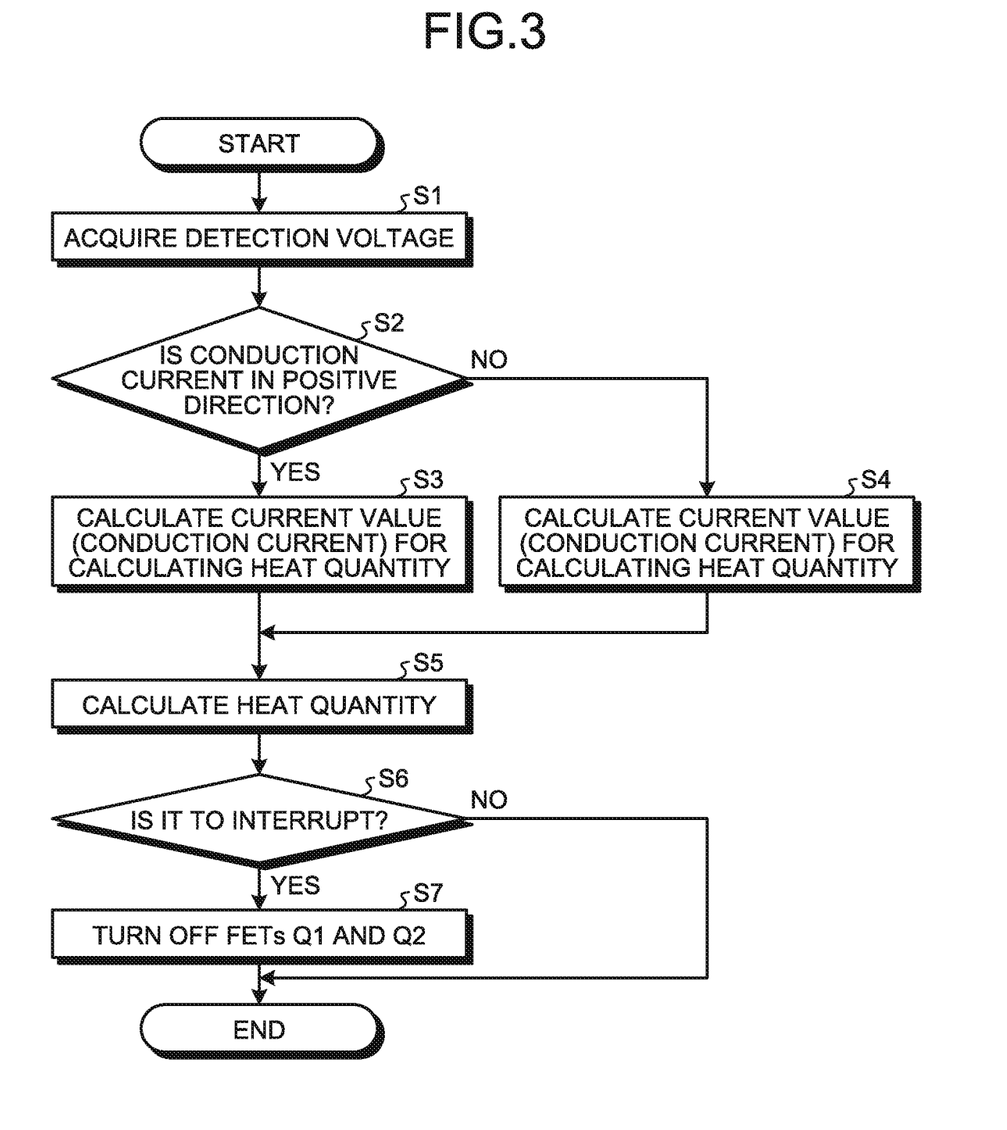
FIG. 3 is a flowchart illustrating an operational example of a controller according to the first embodiment.

Next, an operational example of the controller 32 will be described with reference to FIG. 3. The controller 32 acquires the detection voltage V1 output from the current sensor 31 (step S1). Next, the controller 32 determines whether the conduction current I is in the positive direction P1 (step S2). The controller 32 then compares between the detection voltage V1 and the reference voltage Vth, and determines whether the conduction current I is in the positive direction P1 on the basis of the comparison result. When the detection voltage V1 is larger than the reference voltage Vth, the controller 32 determines that the conduction current I is in the positive direction P1 (Yes at step S2), and calculates the current value (conduction current I) for calculating the heat quantity in the positive direction P1 (step S3). For example, the controller 32 calculates the conduction current I on the basis of the voltage obtained by subtracting the reference voltage Vth from the detection voltage V1. When the detection voltage V1 is 5 V, the controller 32 calculates the conduction current I (100 A) on the basis of 2.5 V obtained by subtracting the reference voltage Vth (2.5 V) from the detection voltage V1 (5 V). Alternatively, when the detection voltage V1 is smaller than the reference voltage Vth, the controller 32 determines that the conduction current I is in the negative direction P2 (No at step S2), and calculates the current value (conduction current I) for calculating the heat quantity in the negative direction P2 (step S4). For example, the controller 32 calculates the conduction current I on the basis of the voltage obtained by subtracting the detection voltage V1 from the reference voltage Vth. When the detection voltage V1 is 0 V, the controller 32 calculates the conduction current I (100 A) on the basis of 2.5 V obtained by subtracting the detection voltage V1 (0 V) from the reference voltage Vth (2.5 V).

Next, the controller 32 calculates the heat quantity of the bi-directional circuit E on the basis of the calculated conduction current I (step S5). For example, the controller 32 calculates the heat quantity of the bi-directional circuit E by substituting the value of the conduction current I in the expression (1) described above. The controller 32 then determines whether to interrupt the bi-directional circuit E on the basis of the calculated heat quantity of the bi-directional circuit E (step S6). For example, the controller 32 compares between the heat quantity of the bi-directional circuit E and the interruption threshold. When the heat quantity of the bi-directional circuit E is equal to or more than the interruption threshold (Yes at step S6), the controller 32 interrupts the bi-directional circuit E by turning OFF the FETs Q1 and Q2 (step S7), and finishes the process. Alternatively, when the heat quantity of the bi-directional circuit E is less than the interruption threshold (No at step S6), the controller 32 continues to turn ON the FETs Q1 and Q2, and finishes the process without interrupting the bi-directional circuit E.

As described above, the current detection device 30 according to the first embodiment includes the current sensor 31 and the controller 32. The current sensor 31 outputs the detection voltage V1 according to the conduction current I that flows through the bi-directional circuit E in which the current can flow in the positive direction P1 and the negative direction P2 that is the direction opposite to the positive direction P1. The controller 32 calculates the conduction current I on the basis of the detection voltage V1 output from the current sensor 31. For example, the controller 32 calculates the conduction current I on the basis of the absolute value of a difference between the reference voltage Vth that is the detection voltage V1 output during the non-conductive state in which current is not flowing through the bi-directional circuit E, and the detection voltage V1 output during the conductive state in which current is flowing through the bi-directional circuit E.

With this configuration, the current detection device detects the conduction current I on the basis of the absolute value of a difference between the reference voltage Vth and the detection voltage V1. Consequently, it is possible to suitably detect the conduction current I flowing in the positive direction P1 and the conduction current I flowing in the negative direction P2. With this configuration, the current detection device 30 can suitably detect the conduction current I flowing in both directions.

In the current detection device 30 described above, when the conduction current I is flowing in the positive direction P1, the current sensor 31 outputs the detection voltage V1 larger than the reference voltage Vth. When the conduction current I is flowing in the negative direction P2, the current sensor 31 outputs the detection voltage V1 smaller than the reference voltage Vth. When the conduction current I is flowing in the positive direction P1, the controller 32 calculates the conduction current I on the basis of the voltage obtained by subtracting the reference voltage Vth from the detection voltage V1. Alternatively, when the conduction current I is flowing in the negative direction P2, the controller 32 calculates the conduction current I on the basis of the voltage obtained by subtracting the detection voltage V1 from the reference voltage Vth. With this configuration, the current detection device 30 can suitably detect the conduction current I flowing in both directions.

The power supply device 1 according to the first embodiment includes the first and second batteries 10A and 10B, the FETs Q1 and Q2, the current sensor 31, and the controller 32. The first and second batteries 10A and 10B supply electric power to the first and second load units 2A and 2B. The FETs Q1 and Q2 conduct or interrupt the conduction current I that flows through the bi-directional circuit E. The bi-directional circuit E is a circuit to which electric power is supplied from the first battery 10A and in which current can flow in the positive direction P1, and to which electric power is supplied from the second battery 10B and in which current can flow in the negative direction P2 that is the direction opposite to the positive direction P1. The current sensor 31 outputs the detection voltage V1 according to the conduction current I. The controller 32 calculates the conduction current I on the basis of the detection voltage V1 output from the current sensor 31, and controls the FETs Q1 and Q2. For example, the controller 32 controls the FETs Q1 and Q2 corresponding to the conduction current I calculated on the basis of the absolute value of a difference between the reference voltage Vth that is the detection voltage V1 output during the non-conductive state in which current is not flowing through the bi-directional circuit E, and the detection voltage V1 output during the conductive state in which current is flowing through the bi-directional circuit E.

With this configuration, the power supply device 1 can obtain the same effects as those of the current detection device 30 described above. Moreover, the power supply device 1 can suitably calculate the heat quantity of the bi-directional circuit E in the positive direction P1 and the negative direction P2. The power supply device 1 can also protect the bi-directional circuit E, by interrupting the bi-directional circuit E on the basis of the heat quantity of the bi-directional circuit E. When the heat quantity of the bi-directional circuit E is calculated in the power supply device 1, the heating values become the same when the conduction current I is 100 A and when the conduction current I is −100 A. However, as in the conventional example, when the heat quantity is calculated by using the detection voltage V1 output from the current sensor 31 as it is, the heat quantity differs when the conduction current I is 100 A and when the conduction current I is −100 A. With the power supply device 1 according to the first embodiment, the heat quantity is obtained according to the conduction current I calculated on the basis of the absolute value of a difference between the reference voltage Vth and the detection voltage V1. Consequently, the heat quantity is the same when the conduction current I is 100 A and when the conduction current I is −100 A. Thus, it is possible to suitably calculate the heat quantity of the bi-directional circuit E.

Modification of First Embodiment

Next, a modification of the first embodiment will be described. The power supply device 1 according to the modification is different from the power supply device 1 of the first embodiment in providing a different interruption threshold depending on the direction of the current flowing through the bi-directional circuit E. It is to be noted that in the modification, the same reference numerals denote the same components as those in the first embodiment, and the detailed descriptions thereof will be omitted.

Figure 4:
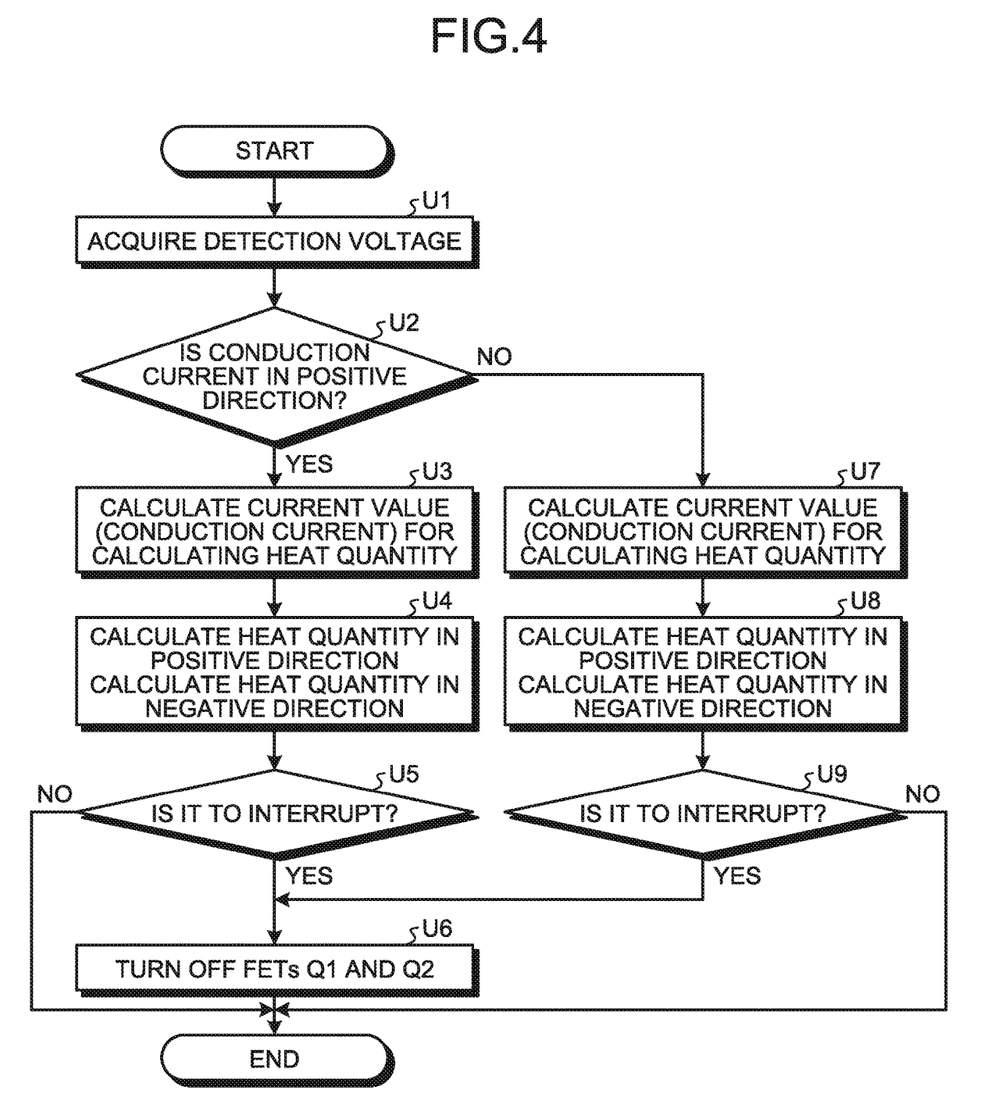
FIG. 4 is a flowchart illustrating an operational example of a controller according to a modification of the first embodiment.

An operational example of the controller 32 of the power supply device 1 according to the modification will be described with reference to FIG. 4. The controller 32 acquires the detection voltage V1 output from the current sensor 31 (step U1). Next, the controller 32 determines whether the conduction current I is in the positive direction P1 (step U2). When the conduction current I is in the positive direction P1 (Yes at step U2), the controller 32 calculates the current value (conduction current I) for calculating the heat quantity in the positive direction P1 (step U3). For example, the controller 32 calculates the conduction current I on the basis of the voltage obtained by subtracting the reference voltage Vth from the detection voltage V1. Next, the controller 32 calculates the heat quantity in the positive direction P1 of the bi-directional circuit E on the basis of the calculated conduction current I (step U4). For example, the controller 32 calculates the heat quantity in the positive direction P1 of the bi-directional circuit E, by substituting the value of the conduction current I in the expression (1) described above. Moreover, the controller 32 calculates the heat quantity in the negative direction P2 of the bi-directional circuit E on the basis of the conduction current I. By calculating the heat quantity in the negative direction P2 also, the controller 32 can correctly calculate the heat quantity in the negative direction P2 when the heat quantity in the negative direction P2 will be calculated the next time. For example, the controller 32 calculates the heat quantity in the negative direction P2 of the bi-directional circuit E, by substituting the value of the conduction current I in the expression (1) described above. In this example, the heat resistance "Rth" and the heat capacity "Cth" in the expression (1) described above differ between when the heat quantity in the negative direction P2 is calculated and when the heat quantity in the positive direction P1 is calculated, for example.

Next, the controller 32 determines whether to interrupt the bi-directional circuit E on the basis of the calculated heat quantity in the positive direction P1 of the bi-directional circuit E (step U5). The controller 32 includes a positive direction interruption threshold that is a threshold for interrupting the conduction current I when the conduction current I is flowing in the positive direction P1. For example, the controller 32 compares between the heat quantity in the positive direction P1 of the bi-directional circuit E and a predetermined positive direction interruption threshold. When the heat quantity in the positive direction P1 of the bi-directional circuit E is equal to or more than the positive direction interruption value (Yes at step U5), the controller 32 turns OFF the FETs Q1 and Q2, interrupts the bi-directional circuit E (step U6), and finishes the process. Alternatively, when the heat quantity in the positive direction P1 of the bi-directional circuit E is less than the positive direction interruption threshold (No at step U5), the controller 32 continues to turn ON the FETs Q1 and Q2, and finishes the process without interrupting the bi-directional circuit E.

Alternatively, at step U2 described above, when the conduction current I is in the negative direction P2 (No at step U2), the controller 32 calculates the current value (conduction current I) for calculating the heat quantity in the negative direction P2 (step U7). For example, the controller 32 calculates the conduction current I on the basis of the voltage obtained by subtracting the detection voltage V1 from the reference voltage Vth. Next, the controller 32 calculates the heat quantity of the bi-directional circuit E on the basis of the calculated conduction current I (step U8). For example, the controller 32 calculates the heat quantity in the negative direction P2 of the bi-directional circuit E on the basis of the conduction current I. For example, the controller 32 calculates the heat quantity in the negative direction P2 of the bi-directional circuit E, by substituting the value of the conduction current I in the expression (1) described above. Moreover, the controller 32 calculates the heat quantity in the positive direction P1 of the bi-directional circuit E on the basis of the conduction current I. By calculating the heat quantity in the positive direction P1 also, the controller 32 can correctly calculate the heat quantity in the positive direction P1 when the heat quantity in the positive direction P1 will be calculated the next time. For example, the controller 32 calculates the heat quantity in the positive direction P1 of the bi-directional circuit E, by substituting the value of the conduction current I in the expression (1) described above. As described above, the heat resistance "Rth" and the heat capacity "Cth" in the expression (1) differ between when the heat quantity in the positive direction P1 is calculated and when the heat quantity in the negative direction P2 is calculated, for example.

Next, the controller 32 determines whether to interrupt the bi-directional circuit E on the basis of the calculated heat quantity in the negative direction P2 of the bi-directional circuit E (step U9). The controller 32 includes a negative direction interruption threshold that is a threshold for interrupting the conduction current I when the conduction current I is flowing in the negative direction P2. The negative direction interruption threshold is a threshold of a value different from that of the positive direction interruption threshold. The controller 32 compares between the heat quantity in the negative direction P2 of the bi-directional circuit E and a predetermined negative direction interruption threshold. When the heat quantity in the negative direction P2 of the bi-directional circuit E is equal to or more than the negative direction interruption threshold (Yes at step U9), the controller 32 turns off the FETs Q1 and Q2, interrupts the bi-directional circuit E (step U6), and finishes the process. Alternatively, when the heat quantity in the negative direction P2 of the bi-directional circuit E is less than the negative direction interruption threshold (No at step U9), the controller 32 continues to turn ON the FETs Q1 and Q2, and finishes the process without interrupting the bi-directional circuit E.

As described above, in the power supply device 1 according to the modification of the first embodiment, when the conduction current I is flowing in the positive direction P1, the controller 32 turns OFF the FETs Q1 and Q2 on the basis of the heat quantity of the bi-directional circuit E defined according to the conduction current I, and the predetermined positive direction interruption threshold. Alternatively, when the conduction current I is flowing in the negative direction P2, the controller 32 turns OFF the FETs Q1 and Q2 on the basis of the heat quantity of the bi-directional circuit E defined according to the conduction current I, and the predetermined negative direction interruption threshold. With this configuration, the power supply device 1 can set a suitable interruption threshold according to the conduction direction. Consequently, it is possible to suitably interrupt the conduction current I in the positive direction P1 and the negative direction P2 of the bi-directional circuit E. For example, the power supply device 1 can set a suitable interruption threshold according to the state of the bi-directional circuit E such as when the first and second load units 2A and 2B are being driven, and when the first and second batteries 10A and 10B are being charged. For example, when the heat resistance and the heat capacity are different between the positive direction P1 and the negative direction P2 according to the state of the bi-directional circuit E, the power supply device 1 can more suitably interrupt the conduction current I by setting each value of the positive direction interruption threshold and the negative direction interruption threshold according to the heat resistance and the heat capacity.

Second Embodiment

Figure 5:
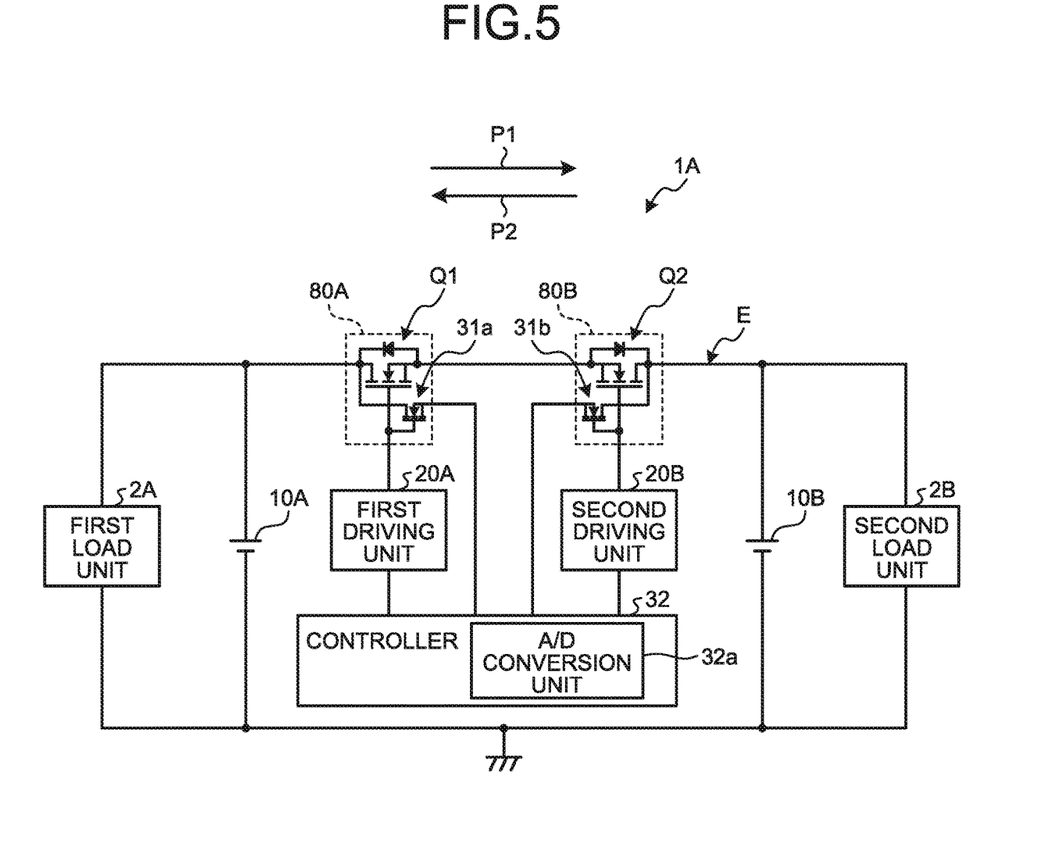
FIG. 5 is a block diagram illustrating a configurational example of a power supply device according to a second embodiment.

Next, a power supply device 1A according to a second embodiment will be described. The power supply device 1A according to the second embodiment is different from the power supply device 1 according to the first embodiment in including a first current sensor 31a that detects the conduction current I in the positive direction P1 and a second current sensor 31b that detects the conduction current I in the negative direction P2. It is to be noted that in the second embodiment, the same reference numerals denote the same components as those in the first embodiment, and the detailed descriptions thereof will be omitted.

The power supply device 1A supplies electric power to the load unit such as a motor from the battery. For example, the power supply device 1A includes the first battery 10A, the second battery 10B, a first switch unit 80A, a second switch unit 80B, the first driving unit 20A, the second driving unit 20B, and the controller 32. The power supply device 1A is what is called a two-battery device provided with the first battery 10A and the second battery 10B.

The first switch unit 80A is an FET fitted with a current sensor. For example, an intelligent power device (IPD) is used for the first switch unit 80A. The first switch unit 80A is including the FET Q1 serving as a first switch and the first current sensor 31a. The FET Q1 is provided between the first battery 10A and the second load unit 2B, and conducts or interrupts the current flowing in the positive direction P1 to the second load unit 2B from the first battery 10A. The first current sensor 31a detects a first detection voltage according to the current flowing in the positive direction P1. The first current sensor 31a is connected to the controller 32, and outputs the detected first detection voltage to the controller 32.

The second switch unit 80B is an FET fitted with a current sensor. For example, the IPD is used for the second switch unit 80B. The second switch unit 80B is including the FET Q2 serving as a second switch and the second current sensor 31b. The FET Q2 is provided between the second battery 10B and the first load unit 2A, and conducts or interrupts the current flowing in the negative direction P2 to the first load unit 2A from the second battery 10B. The second current sensor 31b detects a second detection voltage according to the current flowing in the negative direction P2. The second current sensor 31b is connected to the controller 32, and outputs the detected second detection voltage to the controller 32. The controller 32 calculates the conduction current I flowing in the positive direction P1 on the basis of the first detection voltage output from the first current sensor 31a, and calculates the conduction current I flowing in the negative direction P2 on the basis of the second detection voltage output from the second current sensor 31b. With this configuration, the power supply device 1A according to the second embodiment can detect the conduction current I by the first and second current sensors 31a and 31b. Consequently, it is possible to suitably detect the conduction current I flowing in the positive direction P1 and the conduction current I flowing in the negative direction P2. With this configuration, the power supply device 1A can suitably detect the conduction current I flowing in both directions, and can suitably interrupt the bi-directional circuit E according to the heat quantity of the bi-directional circuit E calculated on the basis of the conduction current I.

The FETs Q1 and Q2 are not limited to the N-channel MOSFET. For example, a semiconductor switch such as a P-channel MOSFET, an insulated gate bipolar transistor (IGBT), and a bipolar transistor may be used for the FETs Q1 and Q2.

Moreover, the bi-directional circuit E in the power supply devices 1 and 1A includes the first battery 10A and the second battery 10B. However, it is not limited thereto. For example, the power supply devices 1 and 1A may include two or more batteries. Moreover, the power supply devices 1 and 1A may include a circuit in which the current flows in both directions. For example, the power supply devices 1 and 1A may include the bi-directional circuit E provided with the first battery 10A and a generator or the like.

Furthermore, in the example, the positive direction interruption threshold and the negative direction interruption threshold are different thresholds. However, it is not limited thereto. For example, the positive direction interruption threshold and the negative direction interruption threshold may be the same threshold, when the heat resistance "Rth" and the heat capacity "Cth" are the same in the positive direction P1 and the negative direction P2.

A current detection device and a power supply device according to the present embodiment calculate a conduction current on the basis of the absolute value of a difference between the reference voltage and the detection voltage. Consequently, it is possible to suitably detect the current flowing in both directions. The power supply device according to the present embodiment calculates the current flowing in the positive direction on the basis of the first detection voltage output from the first current sensor, and calculates the current flowing in the negative direction on the basis of the second detection voltage output from the second current sensor. Consequently, it is possible to suitably detect the current flowing in both directions.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A current detection device, comprising:
  a current sensor that outputs a detection voltage according to a conduction current flowing through a bi-directional circuit in which current is capable of flowing in a positive direction and a negative direction that is a direction opposite to the positive direction; and
  a controller that calculates the conduction current based on the detection voltage output from the current sensor, wherein
  the controller calculates the conduction current based on an absolute value of a difference between a reference voltage that is the detection voltage output during a non-conductive state in which current is not flowing through the bi-directional circuit, and the detection voltage output during a conductive state in which current is flowing through the bi-directional circuit.

2. The current detection device according to claim 1, wherein
  the current sensor outputs the detection voltage larger than the reference voltage when the conduction current is flowing in the positive direction, and outputs the detection voltage smaller than the reference voltage when the conduction current is flowing in the negative direction, and
  the controller calculates the conduction current based on voltage obtained by subtracting the reference voltage from the detection voltage when the conduction current is flowing in the positive direction, and calculates the conduction current based on voltage obtained by subtracting the detection voltage from the reference voltage when the conduction current is flowing in the negative direction.

3. A power supply device, comprising:
  first and second electric power supply units that supply electric power to a load unit;
  a switch that conducts or interrupts conduction current that flows through a bi-directional circuit to which electric power is supplied from the first electric power supply unit and in which current is capable of flowing in a positive direction, and to which electric power is supplied from the second electric power supply unit and in which current is capable of flowing in a negative direction that is a direction opposite to the positive direction;
  a current sensor that outputs a detection voltage according to the conduction current; and a controller that controls the switch by calculating the conduction current based on the detection voltage output from the current sensor, wherein the controller controls the switch according to the conduction current calculated based on an absolute value of a difference between a reference voltage that is the detection voltage output during a non-conductive state in which current is not flowing through the bi-directional circuit, and the detection voltage output during a conductive state in which current is flowing through the bi-directional circuit.

4. The power supply device according to claim 3, wherein the controller turns OFF the switch based on a heat quantity of the bi-directional circuit defined according to the conduction current and a predetermined positive direction interruption threshold, when the conduction current is flowing in the positive direction, and the controller turns OFF the switch based on the heat quantity of the bi-directional circuit defined according to the conduction current and a predetermined negative direction interruption threshold, when the conduction current is flowing in the negative direction.

* * * * *